United States Patent [19]

Vogel

[11] Patent Number: 4,967,275
[45] Date of Patent: Oct. 30, 1990

[54] TV RECEIVER HAVING A RF SIGNAL SPLITTER THAT SUPPLIES MORE SIGNAL ENERGY TO A FIRST TUNING CIRCUIT THAN TO THE SECOND SUBSTANTIALLY ACCORDING TO THE PICTURE DISPLAY RATIO OF THE FIRST AND SECOND TV PROGRAMS

[75] Inventor: Willem J. Vogel, Eindhoven, Netherlands

[73] Assignee: U.S. Philips Corporation, New York, N.Y.

[21] Appl. No.: 358,983

[22] Filed: May 30, 1989

[30] Foreign Application Priority Data

Jun. 2, 1988 [NL] Netherlands ................. 8801413

[51] Int. Cl.$^5$ .............................................. H04N 5/45
[52] U.S. Cl. ................... 358/183; 358/191.1
[58] Field of Search ............... 358/188, 191.1, 183, 358/22

[56] References Cited

U.S. PATENT DOCUMENTS

| 4,249,211 | 2/1981 | Baba et al. |
|---|---|---|
| 4,623,915 | 11/1986 | Bolger ............................... 358/183 |
| 4,725,888 | 2/1988 | Hakamada . |
| 4,729,027 | 3/1988 | Hakamada et al. . |
| 4,746,983 | 5/1988 | Hakamada . |
| 4,761,688 | 8/1988 | Hakamada et al. . |
| 4,774,582 | 9/1988 | Hakamada et al. . |
| 4,777,531 | 10/1988 | Hakamada et al. . |
| 4,845,564 | 7/1989 | Hakamada et al. ................. 358/183 |

OTHER PUBLICATIONS

CATV Splitter, Model CA-2133, p. 176, Forham Radio Catalog 1983.

Primary Examiner—Howard W. Britton
Assistant Examiner—Kim Yen Vu
Attorney, Agent, or Firm—Edward W. Goodman

[57] ABSTRACT

TV receiver including a RF signal splitter coupled to an aerial input and having first and second RF signal terminals to which first and second tuning circuits for tuning to first and second TV programs, respectively, are connected, the first and second tuning circuits being connected via first and second TV-IF signal processing circuits to a device for displaying the picture of the second TV program in the picture of the first TV program, which RF signal splitter supplies more signal energy to the first tuning circuit than to the second. To provide the possibility of a simple and inexpensive realization of the TV receiver while maintaining at least an acceptable display quality of the picture-in-picture signal, the second tuning circuit is chosen to be a circuit whose dynamic range, within which a substantially linear signal processing is possible, is smaller than that of the first tuning circuit.

2 Claims, 1 Drawing Sheet

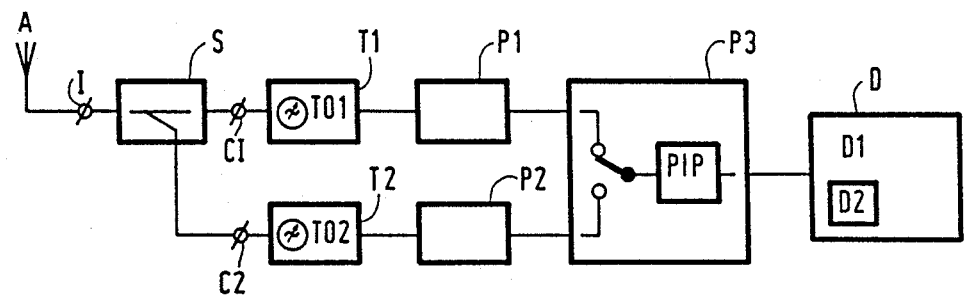

TV RECEIVER HAVING A RF SIGNAL SPLITTER THAT SUPPLIES MORE SIGNAL ENERGY TO A FIRST TUNING CIRCUIT THAN TO THE SECOND SUBSTANTIALLY ACCORDING TO THE PICTURE DISPLAY RATIO OF THE FIRST AND SECOND TV PROGRAMS

BACKGROUND OF THE INVENTION

1. Field of the Invention

The invention relates to a TV receiver including an RF signal splitter coupled to an aerial input and having first and second RF signal terminals to which first and second tuning circuits, for tuning to first and second TV programs, respectively, are connected, said first and second tuning circuits being connected via first and second TV-IF signal processing circuits to a device for displaying the picture of the second TV program in the picture of the first TV program, said RF signal splitter supplying more signal energy to the first tuning circuit than to the second.

2. Description of the Related Art

A TV receiver of this type is known, for example, from European Patent Application No. 229027.

The known TV receiver provides the possibility of simultaneous reception of two TV programs. To this end the received RF signal energy in the RF signal splitter is evenly distributed between the first and second signal terminals and applied via these terminals to the first and second tuning circuits. These tuning circuits are tunable at mutually different television transmission frequencies and supply first and second IF-TV program signals, respectively, which are converted via the first and second TV-IF signal processing circuits into two baseband TV programs. In the picture-in-picture display device, the video information of these two baseband TV program signals is subsequently formed to a picture-in-picture video signal with which the first TV program is displayed on the complete picture area of the TV screen, with the exception of an inset in which the second TV program is displayed.

In the known TV receiver, the signal loss of the TV-RF signal which is applied to the first tuning circuit is considerably limited at the expense of the signal energy of the TV-RF signal which is applied to the second tuning circuit. The known TV receiver comprises a broadband RF signal amplifier arranged between the second RF signal terminal and the second tuning circuit. This amplifier is not only used for amplifying the RF signal applied to the second tuning circuit, but also for preventing the oscillators of the two tuning circuits from mutually influencing each other due to the fact that the oscillator radiation is directed from these oscillators to the RF signal splitter. However, such broadband RF signal amplifiers contribute to the fact that unwanted strong signals in or near the RF-TV frequency range, such as, for example mobilophone signals, may give rise to an overload of the circuits in the TV-RF input section.

SUMMARY OF THE INVENTION

It is an object of the invention to provide a TV receiver of the type described in the opening paragraph, which can be realized in a simpler manner and at lower cost than the known TV receiver.

According to the invention, a TV receiver of this type is therefore characterized in that the input dynamic range of the second tuning circuit, within which a substantially linear signal processing is possible, is smaller than that of the first tuning circuit.

The invention is based on the recognition that the larger signal attenuation of the RF signal splitter for the signal at the second signal terminal has the advantage that the signal dynamic range at this second signal terminal is smaller than that at the first signal terminal.

When using the measure according to the invention, it will be possible to realize the second tuning circuit in a comparatively simple and hence inexpensive manner, and to dispense with a signal amplification for this second tuning circuit. The cost price of the TV receiver as a whole will therefore be lower.

A further preferred embodiment of such a TV receiver is characterized by an interchange of the tuning frequencies of the two tuning circuits when a given mutual ratio between the surface area values of the display areas of the two programs is attained.

This measure provides the possibility of enlarging the picture of the second TV program at the expense of the picture of the first TV program without visible quality loss in the picture-in-picture display.

BRIEF DESCRIPTION OF THE DRAWING

The invention will be described in greater detail with reference to the sole FIGURE in the drawing showing a block diagram of a TV receiver, which FIGURE only serves an illustrative purpose.

DESCRIPTION OF THE PREFERRED EMBODIMENT

This sole FIGURE shows a block diagram of a TV receiver according to the invention, comprising an aerial input I connected to an aerial A to which an RF power splitter is coupled, which operates as an RF signal splitter S and which has first and second RF signal terminals C1 and C2 to which first and second tuning circuits T1 and T2, respectively, are coupled, followed by first and second TV-IF signal processing circuits and baseband signal processing circuits P1 and P2. These circuits P1 and P2 are coupled to a device P3 for forming a picture-in-picture (also referred to as PIP) video signal, followed by a picture display device D.

The operation of the circuits T1, T2, P1-P3 and D are known in principle, for example from the first-mentioned Article in "Radio Mentor Elektronik". For the sake of simplicity the circuits for amplifying and displaying the TV sound signals are not shown. To understand the invention, it is sufficient to know that the first and second tuning circuits T1 and T2 comprise first and second tuning oscillators TO1 and TO2, respectively, by means of which first and second desired RF-TV program signals from an RF-TV frequency range presented to the RF inputs of T1 and T2 can be converted to a TV intermediate frequency, which signals are converted into first and second baseband TV program signals after selection, amplification and detection in the TV-IF and baseband signal processing circuits P1 and P2. These two baseband TV program signals are subsequently composed in the device P3 to a single picture-in-picture video signal which fills an inset D2 with the picture signal of the second TV program and which fills the remaining area D1 with the picture signal of the first TV program upon display on the screen of the display device D.

In contrast to the known TV receiver, an asymmetric RF power splitter instead of a symmetric 3 dB RF signal splitter is used in the TV receiver according to the invention. This power splitter splits the received RF signal energy to the first and second RF signal terminals C1 and C2 in a ratio which is preferably substantially determined by the surface area ratio between D1 and D2. In practice a mutual ratio in signal energy of 9:1 between C1 and C2 with a surface area ratio of the areas D1 and D2 of substantially 9:1 is found to yield a satisfactory picture-in-picture display of the first and second TV programs.

Due to the larger attenuation of the RF signal from I1 to C2 as compared with that from I1 to C1 the result is hardly influenced when a tuning circuit having a smaller dynamic input range than that of the first tuning circuit T1 is used for the second tuning circuit T2. This lower specification requirement provides the possibility of using a tuning circuit for T2 which is considerably cheaper than that for T2.

Moreover, it is possible to increase the signal attenuation from C1 to C2, and conversely, to a sufficient extent to avoid mutual influence of TO1 and TO2 without using buffer amplifiers between C1 and T1 and C2 and T2, respectively, and/or without taking special measures in T1 and T2.

Furthermore, the TV receiver shown can be provided with known means for increasing the surface area of D2 at the expense of that of D1. It may be advantageous to interchange the tuning frequencies of T1 and T2 when a threshold value in the surface area ratio between D2 and D1 is exceeded, so that a signal-to-noise ratio for the second TV program will be available which is larger than that for the first TV program. For those skilled in the art it will not be difficult to find a suitable threshold value, starting from the power ratio of the TV-RF signals at C1 and C2 and to effect the change-over (not shown) automatically.

I claim:

1. A TV receiver including an RF signal splitter coupled to an aerial input and having first and second RF signal terminals to which first and second tuning circuits for tuning to first and second TV programs, respectively, are connected, said first and second tuning circuits being connected via first and second TV-IF signal processing circuits to a device for displaying the picture of the second TV program in the picture of the first TV program, said RF signal splitter supplying more signal energy to the first tuning circuit than to the second, characterized in that the input dynamic range of the second tuning circuit, within which a substantially linear signal processing is possible, is smaller than that of the first tuning circuit.

2. A TV receiver as claimed in claim 1, provided with means for enlarging the display area of the second TV program at the expense of that of the first TV program, and conversely, characterized by a mutual interchange of the tuning frequencies of the two tuning circuits when a given mutual ratio between the surface area values of the display areas of the two programs is attained.

* * * * *